US 6,731,129 B1

(12) United States Patent
Belluomini et al.

(10) Patent No.: US 6,731,129 B1
(45) Date of Patent: May 4, 2004

(54) APPARATUS FOR MEASURING CAPACITANCE OF A SEMICONDUCTOR DEVICE

(75) Inventors: Wendy Ann Belluomini, Austin, TX (US); Chandler Todd McDowell, Austin, TX (US); Sani Richard Nassif, Austin, TX (US); Ying Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/322,074

(22) Filed: Dec. 17, 2002

(51) Int. Cl.[7] ............................................. G01R 31/28
(52) U.S. Cl. .................. 324/765; 324/769; 324/763; 324/678
(58) Field of Search ................. 324/765, 679, 324/676, 677, 678, 519, 769, 158.1, 537, 658; 327/206, 210

(56) References Cited

U.S. PATENT DOCUMENTS

| | | |
|---|---|---|
| 4,459,541 A | 7/1984 | Fielden et al. |
| 6,366,098 B1 * | 4/2002 | Froment ..................... 324/678 |
| 6,404,222 B1 * | 6/2002 | Fan et al. .................... 324/765 |
| 6,501,283 B2 * | 12/2002 | Lindolf et al. .............. 324/679 |
| 6,549,029 B1 * | 4/2003 | Hsieh et al. ................. 324/769 |

OTHER PUBLICATIONS

Chen, et al., "An On–Chip, Attofarad Interconnect Charge–Based Capacitance Measurement (CBCM) Technique," 1996 IEEE, Dept. of EECS, University of California Berkeley, 211–37 Cory Hall #1772, Berkeley, California.

* cited by examiner

Primary Examiner—David A. Zarneke
Assistant Examiner—Jimmy Nguyen
(74) Attorney, Agent, or Firm—Casimer K. Salys; Bracewell & Patterson, L.L.P.

(57) ABSTRACT

An apparatus for measuring capacitance of a semiconductor device is disclosed. The apparatus includes a signal source circuit, a first transistor, a second transistor, and bypass capacitor. The first transistor is connected in series with the second transistor, and the second transistor is connected in series with a device under test. The bypass capacitor connected in parallel with the first and second transistors. Coupled to the first and second transistors, the signal source circuit generates a first signal and a second signal to alternately turn on said first and second transistors such that a discharge current is generated to flow through the first and second transistors.

21 Claims, 4 Drawing Sheets

APPARATUS FOR MEASURING CAPACITANCE OF A SEMICONDUCTOR DEVICE

BACKGROUND OF THE INVENTION

1. Technical Field

The present invention relates to capacitance measurements in general, and in particular to an apparatus for measuring capacitance. Still more particularly, the present invention relates to an apparatus for measuring capacitance of a semiconductor device.

2. Description of the Related Art

Fundamentally, $$C=Q/V \quad (1)$$

where

C=capacitance of a capacitor;

Q=charge within the capacitor; and

V=voltage across the capacitor.

Thus, if a known amount of charge is placed within a capacitor, the capacitance of the capacitor can be determined by measuring the voltage across the capacitor. However, if charges are placed on the capacitor and are then dumped to ground in a cyclical fashion, a discharge current can be formed as follows:

$$I=QF \quad (2)$$

where

I=discharge current;

Q=charge within the capacitor; and

F=frequency of the charge/discharge cycle.

By combining equations (1) and (2), $$C=I/(VF) \quad (3)$$

Hence, an accurate capacitance measurement of a capacitor can be obtained by monitoring the discharge current if the voltage and frequency are maintained constant.

A circuit for measuring capacitance of a semiconductor device typically includes a pair of transistors driven by a stable frequency oscillator. The pair of transistors are turned on and off alternately, with one transistor being arranged to charge the semiconductor device to a known voltage and the other transistor being arranged to discharge the semiconductor device to zero voltage. The discharge current is monitored to provide a measure of the capacitance of the semiconductor device.

However, the capacitance of the semiconductor device being measured may be influenced or overshadowed by the parasitic elements, such as parasitic capacitance, parasitic inductance and/or parasitic resistance, which inherently existed between the capacitance measuring circuit and the semiconductor device. As a result, the capacitance measurement may not be as accurate as it should be. Consequently, it is desirable to provide an improved apparatus for measuring capacitance of a semiconductor device.

SUMMARY OF THE INVENTION

In accordance with a preferred embodiment of the present invention, a capacitance measuring circuit includes a signal source circuit, a first transistor, a second transistor, and bypass capacitor. The first transistor is connected in series with the second transistor, and the second transistor is connected in series with a device under test. The bypass capacitor connected in parallel with the first and second transistors. Coupled to the first and second transistors, the signal source circuit generates a first signal and a second signal to alternately turn on said first and second transistors such that a discharge current is generated to flow through the first and second transistors.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
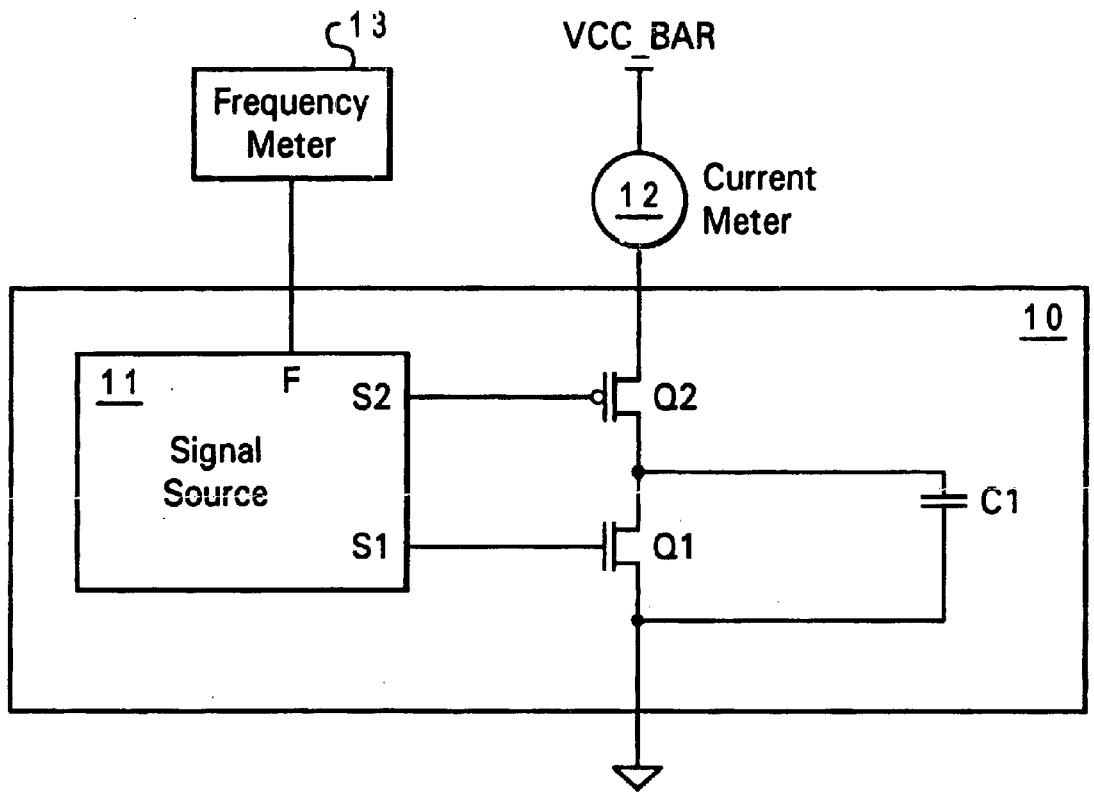
FIG. 1 is a block diagram of an apparatus for measuring capacitance of a semiconductor device, in accordance with a first embodiment of the present invention.

Referring now to the drawings and, in particular, to FIG. 1, there is depicted a block diagram of an apparatus for measuring capacitance of a semiconductor device, in accordance with a first embodiment of the present invention. As shown, a signal source circuit 11, an n-channel transistor Q1, a p-channel transistor Q2, and a device under test (DUT) C1 are formed within a single semiconductor structure 10. The current passing through transistors Q1 and Q2 is measured by a current meter 12 located external to semiconductor structure 10. Similarly, the frequency output from signal source circuit 11 is measured by a frequency meter 13 located external to semiconductor structure 10.

Signal source circuit 11 generates signals S1 and S2 for turning transistors Q1, Q2 on and off alternately. The frequency of signal S1 or signal S2 should be the same as the frequency of signal F. Signals S1 and S2 preferably have some or all of the following properties:

1. square waves that are 180 degrees out of phase from each other;
2. underlapped from each other so that transistors Q1, Q2 are never turned on at the same time;
3. the high value of signals S1 and S2 is different than the supply voltage VCC_BAR (higher for better drive, lower for process limits); and
4. the low value of signals S1 and S2 is lower than that of supply voltage VCC_BAR (to reduce leakage of current through an "off" device).

Initially, DUT C1 is charged to a supply voltage VCC_BAR by having transistor Q2 turned on and transistor Q1 turned off. Transistor Q2 acts as a resistor when DUT C1 is being charged. After DUT C1 has reached the supply voltage VCC_BAR, transistor Q2 is turned off and transistor Q1 is turned on to allow the charges stored within DUT C1 to be drained to ground. The above-mentioned charge/discharge cycle is repeated many times per second to provide a steady discharge current that can be measured by current meter 12.

Figure 2:
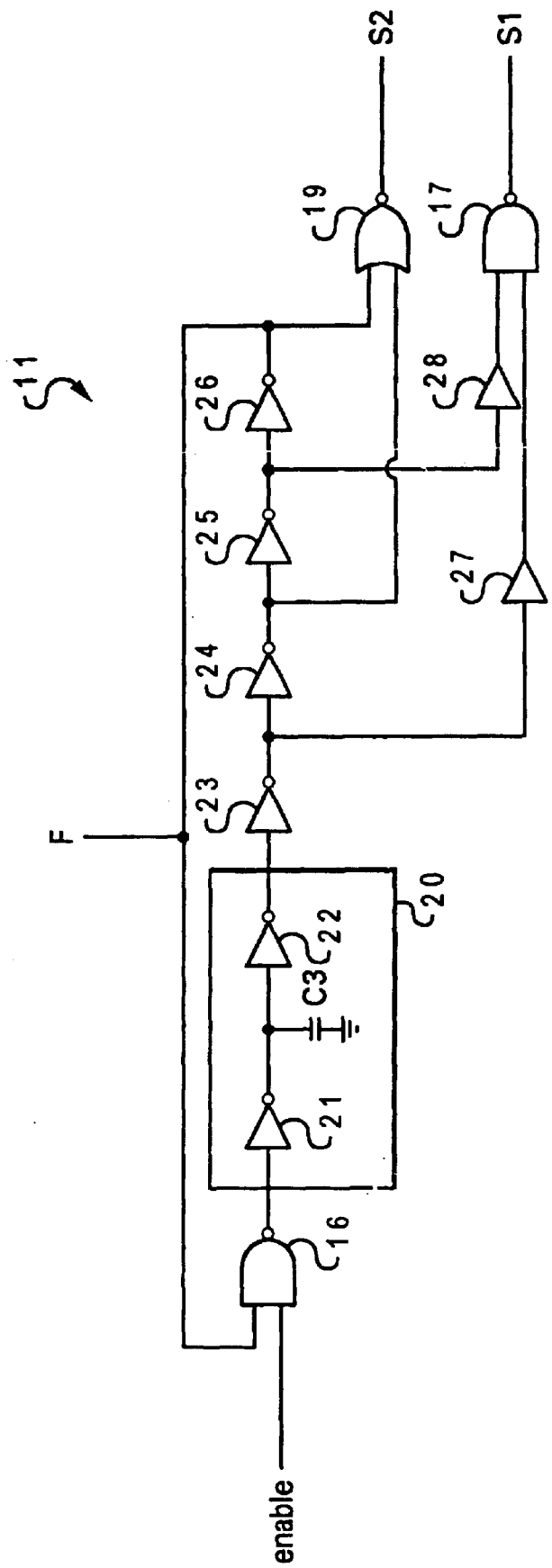
FIG. 2 is a circuit diagram of the signal source circuit within the apparatus from FIG. 1, in accordance with a preferred embodiment of the present invention.

With reference now to FIG. 2, there is depicted a circuit diagram of signal source circuit 11, in accordance with a preferred embodiment of the present invention. As shown, signal source circuit 11 includes an NAND gate 16 and six inverters 21–26 serially connected in a ring oscillator configuration. NAND gate 16 includes an Enable input to initiate an oscillation within signal source circuit 11. Signal source circuit 11 also includes an NOR gate 19 to yield signal S2, and an NAND gate 17 along with buffers 27–28 to yield signal S1. As mentioned previously, signals S1 and S2 turn transistors Q1 and Q2 (from FIG. 1) on and off in an alternate but non-overlapping manner. Buffers 27 and 28 can be adjusted for proper alignment of signals S1 and S2.

A delay segment 20, which includes inverters 21–22 and a capacitor C3, determines how long DUT C1 (from FIG. 1) should be charged or discharged per cycle. The resistor-capacitor (RC) time constant formed by inverter 21 and capacitor C3 ($RC_{ro}$) should be much greater than the RC time constant formed by transistor Q2 and DUT C1 or transistor Q1 and DUT C1 ($RC_{dut}$). Inverter 21 and capacitor C3 can be adjusted to allow many $RC_{dut}$ time constants to lapse before inverter 22 flips.

Figure 3:
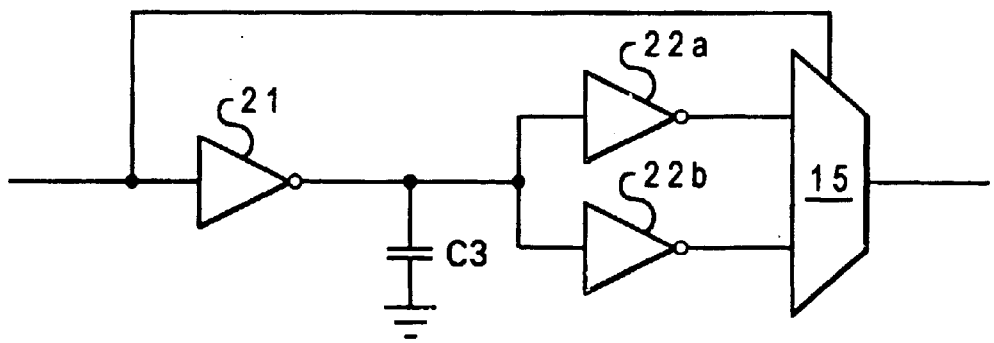
FIG. 3 is a circuit diagram of the delay circuit within the signal source circuit from FIG. 2, in accordance with a preferred embodiment of the present invention.

The performance of delay segment 20 can be improved by the configuration as shown in FIG. 3. Basically, inverter 22 in FIG. 2 is substituted by inverters 22a–22b and a multiplexor 15. Inverter 22a is for charging capacitor C3, inverter 22b is for discharging capacitor C3, and multiplexor 15 is for selecting the appropriate output signal according to the input signal to inverter 21. Thus, inverters 22a–22b can be considered as high and low switch point inverters, respectively. The closer the switch points are to the supply voltage, the more time can be elapsed for a given $RC_{ro}$. This keeps inverter 21 and capacitor C3 reasonable small. Inverter 22a can be greater than 90% of the supply voltage and inverter 22b can be less than 10% of the supply voltage.

Figure 4:
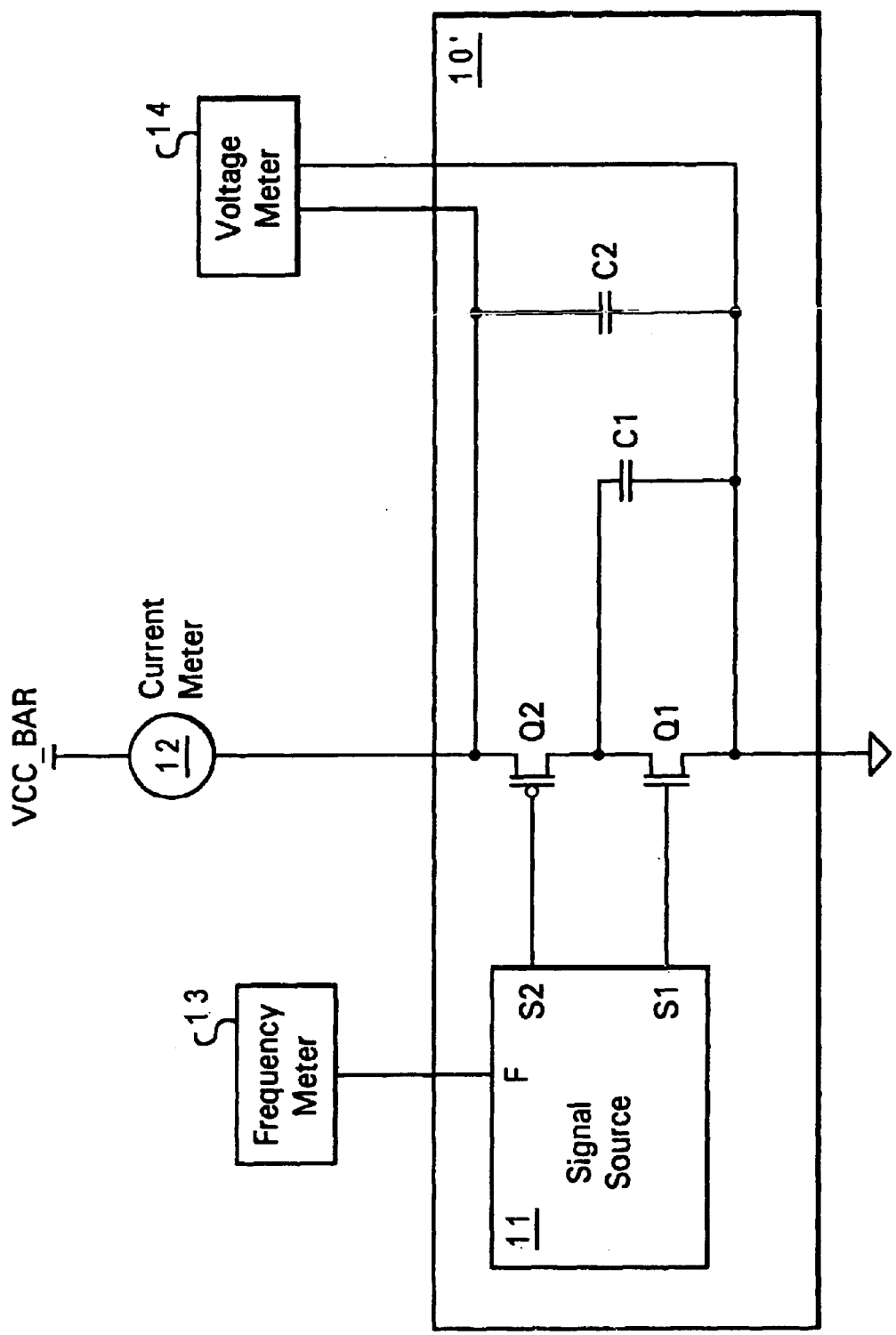
FIG. 4 is a block diagram of an apparatus for measuring capacitance of a semiconductor device, in accordance with a second embodiment of the present invention.

With reference now to FIG. 4, there is depicted a block diagram of an apparatus for measuring capacitance of a semiconductor device, in accordance with a second embodiment of the present invention. As shown, signal source circuit 11, n-channel transistor Q1, p-channel transistor Q2, DUT C1 and a bypass capacitor C2 are formed within a single semiconductor structure 10'. Bypass capacitor C2 and transistors Q1–Q2 are connected in parallel with a voltage meter (or voltmeter) 14. Bypass capacitor C2 provides additional charge for the switching transients that occur when DUT C1 is being charged or being discharged. The capacitance of bypass capacitor C2 is preferably 100 times greater than the capacitance of DUT C1. It is also important that bypass capacitor C2 does not have a high charge leakage because any charge leakage will be manifested in current meter 12.

Also, in FIG. 1, the voltage that DUT C1 can achieve will not be as high as the supply voltage VCC_BAR because DC current will be flowing through the parasitic resistor inherently occurred along the interconnects between transistor Q2 and current meter 12. The configuration in FIG. 4 can avoid the above-mentioned problem by measuring the voltage across capacitor C2 because the voltages of DUT C1 and capacitor C2 should be equalized at the end of each charge/discharge cycle. Voltage meter 14 preferably has an internal resistance of greater than 100 GΩ. Hence, the current flowing through the parasitic resistances within the interconnects between capacitor C2 and voltage meter 14 should be negligible as long as the voltage of capacitor C2 is stable. However, the size of capacitor C2 can be prohibitive large in order to make the voltage of capacitor C2 completely stable. One solution to such problem is by selectively sampling the voltage on capacitor C2 as shown in FIG. 5.

Figure 5:
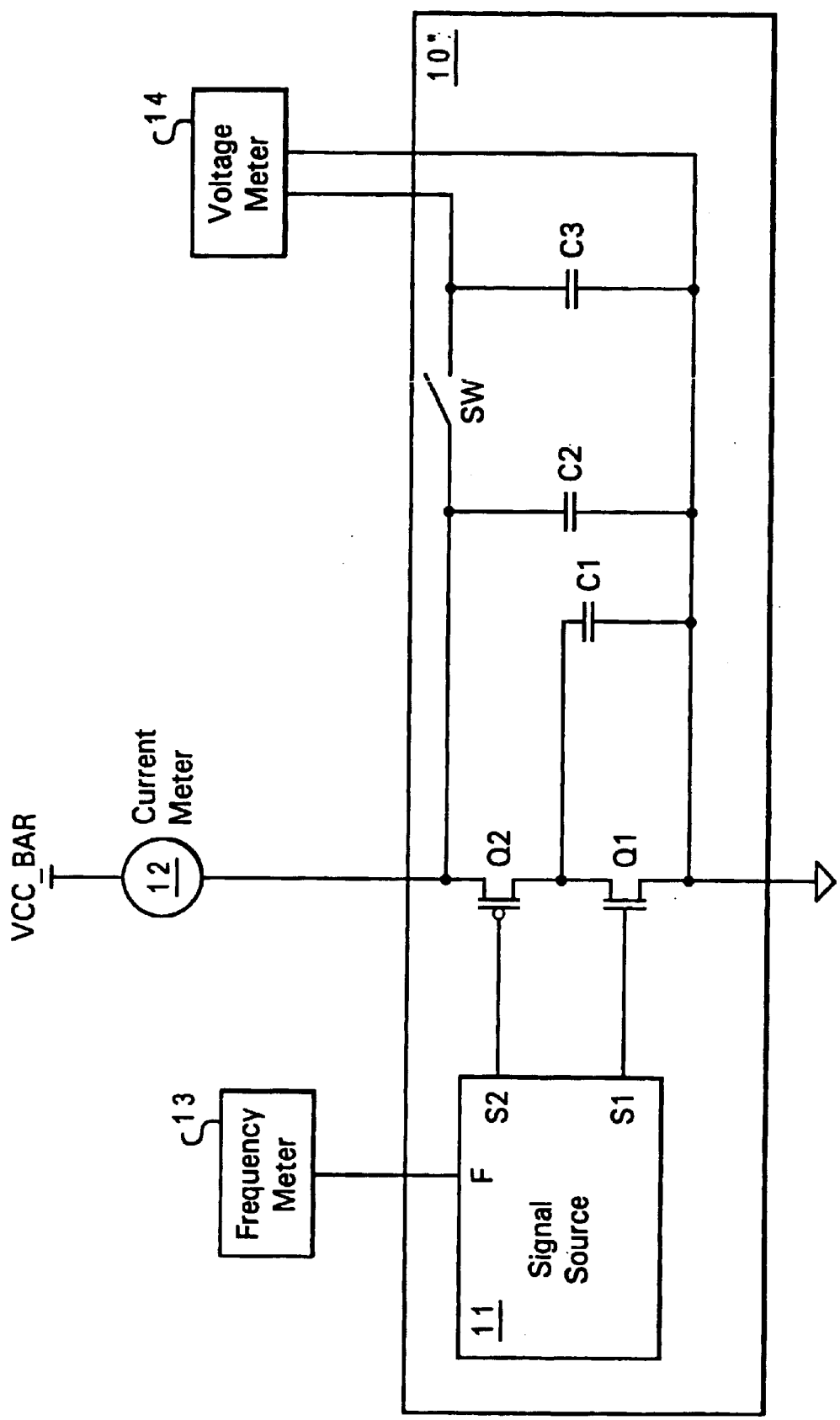
FIG. 5 is a block diagram of an apparatus for measuring capacitance of a semiconductor device, in accordance with a third embodiment of the present invention.

Referring now to FIG. 5, there is depicted is a block diagram of an apparatus for measuring capacitance of a semiconductor device, in accordance with a third embodiment of the present invention. As shown, signal source circuit 11, n-channel transistor Q1, p-channel transistor Q2, DUT C1, bypass capacitor C2, capacitor C3 and a switch SW are formed within a single semiconductor structure 10". Bypass capacitor C2, capacitor C3 and transistors Q1–Q2 are connected in parallel with voltage meter 14. Switch SW is connected between bypass capacitor C2 and capacitor C3. The operation of switch SW is controlled by signal source circuit 11. For example, switch SW is opened when transistor Q2 is turned off while transistor Q1 is turned on, and switch SW is closed when transistor Q2 is turned on while transistor Q1 is turned off.

The voltage on bypass capacitor C2 dips when capacitor C1 is being charged though transistor Q2. At some point during a charge/discharge cycle, the voltages on capacitor C1 and bypass capacitor C2 equal to each other. At the end of the charge/discharge cycle, switch SW is closed to connect capacitor C3 to bypass capacitor C2. If the voltage on capacitor C3 is different than the stabilized voltage between capacitor C1 and bypass capacitor C2, charge will be re-distributed and current will flow through current meter 12. Eventually, the charge re-distribution settles down and the voltage on capacitor C3 becomes the stabilized voltage on capacitor C1 and bypass capacitor C2 (even though the voltage in between fluctuates). The stabilized voltage is then measured by voltage meter 14.

Capacitor C3 should be of a low leakage type, though it is not as important as in bypass capacitor C2 because capacitor C3 is not always connected to all the components. Preferably, the size of capacitor C3 should be large enough to prevent a voltage dip due to current leakage through voltage meter 14, switch SW or itself. On the other hand, if the size of capacitor C3 is too large, it may take a long time to reach a stabilized voltage.

As has been described, the present invention provides an improved apparatus for measuring capacitance of a semiconductor device. Although a single DUT is utilized to illustrate the present invention, the capacitance measuring circuit of the present invention is capable of measuring multiple DUTs simultaneously. In fact, signal source circuit 11, bypass capacitor C2 (which can be the second DUT), switch SW and capacitor C3 can be arranged in the same configuration when multiple DUTs are being measured. However, it is important to guarantee that the leakage of too many transistors Q2/Q1 does not compromise all the required measurements. Although a single signal source circuit 11 can be used for measuring more than one DUT, additional bypass capacitor C2, switch SW, and capacitor C3 will be needed at some point. The accuracy of capacitance measurement can be further enhanced by reducing the leakage through transistor Q1 and transistor Q2. Leakage can be reduced by using high threshold $V_t$ transistors. Such transistors leak less when they are turned off. Another option is to bias the body of transistor Q1 negatively and the body of transistor Q2 positively. Such body bias would also reduce the "off" state leakage current.

While the invention has been particularly shown and described with reference to a preferred embodiment, it will be understood by those skilled in the art that various changes in form and detail may be made therein without departing from the spirit and scope of the invention.

What is claimed is:

1. A test structure within a semiconductor for measuring capacitance of a device within said semiconductor, said test structure comprising:
   a first transistor connected in series with a second transistor;
   a device under test connected in parallel with said first transistor;
   a bypass capacitor connected in parallel with said first and second transistors; and
   a signal source circuit, coupled to said first and second transistors, for generating a first signal and a second signal to alternately turn on said first and second transistors such that a discharge current is generated to flow through said first and second transistors, wherein said discharge current is proportional to a capacitance value of said device under test.

2. The test structure of claim 1, wherein said first transistor is an n-channel transistor and said second transistor is p-channel transistor.

3. The test structure of claim 1, wherein said signal source circuit is a ring oscillator.

4. The test structure of claim 1, wherein a capacitance value of said bypass capacitor is higher than a capacitance value of said device under test.

5. The test structure of claim 1, wherein said capacitance value of said device under test is determined by utilizing said discharge current, a supply voltage to said first and second transistors, and a frequency of said first and second transistors being on.

6. An apparatus for measuring capacitance of a semiconductor device, said apparatus comprising:
   a first transistor connected in series with a second transistor;
   a device under test connected in parallel with said first transistor;
   a bypass capacitor connected in parallel with said first and second transistors; and
   a signal source circuit, coupled to said first and second transistors, for generating a first signal and a second signal to alternately turn on said first and second transistors such that a discharge current is generated to flow through said first and second transistors, wherein said discharge current is proportional to a capacitance value of said device under test.

7. The apparatus of claim 6, wherein said first transistor is an n-channel transistor and said second transistor is p-channel transistor.

8. The apparatus of claim 6, wherein said signal source circuit is a ring oscillator.

9. The apparatus of claim 6, wherein a capacitance value of said bypass capacitor is higher than a capacitance value of said device under test.

10. The apparatus of claim 6, wherein said apparatus further includes a voltmeter connected in parallel with said first and second transistors to determine a voltage across said device under test.

11. The apparatus of claim 6, wherein said apparatus further includes a current meter connected in series with said first and second transistors to determine said discharge current.

12. The apparatus of claim 6, wherein said apparatus further includes a frequency meter connected to said signal source circuit to determine a frequency of said first and second transistors being on.

13. The apparatus of claim 6, wherein said capacitance value of said device under test is determined by utilizing said discharge current, a supply voltage to said first and second transistors, and a frequency of said first and second transistors being on.

14. An apparatus for measuring capacitance of a semiconductor device, said apparatus comprising:
   a first transistor connected in series with a second transistor;
   a device under test connected in parallel with said first transistor;
   a bypass capacitor connected in parallel with said first and second transistors;
   a capacitor connected in parallel with said bypass capacitor;
   a switch connected between said bypass capacitor and said capacitor; and
   a signal source circuit, coupled to said first and second transistors, for generating a first signal and a second signal to alternately turn on said first and second transistors such that a discharge current is generated to flow through said first and second transistors, wherein said discharge current is proportional to a capacitance value of said device under test.

15. The apparatus of claim 14, wherein said first transistor is an n-channel transistor and said second transistor is p-channel transistor.

16. The apparatus of claim 14, wherein said signal source circuit is a ring oscillator.

17. The apparatus of claim 14, wherein capacitance values of said bypass capacitor and said capacitor are higher than a capacitance value of said device under test.

18. The apparatus of claim 14, wherein said apparatus further includes a voltmeter connected in parallel with said first and second transistors to determine a voltage across said device under test.

19. The apparatus of claim 14, wherein said apparatus further includes a current meter connected in series with said first and second transistors to determine said discharge current.

20. The apparatus of claim 14, wherein said apparatus further includes a frequency meter connected to said signal source circuit to determine a frequency of said first and second transistors being on.

21. The apparatus of claim 14, wherein said capacitance value of said device under test is determined by utilizing said discharge current, a supply voltage to said first and second transistors, and a frequency of said first and second transistors being on.

* * * * *